(12) United States Patent
Cho et al.

(10) Patent No.: US 7,639,539 B2
(45) Date of Patent: Dec. 29, 2009

(54) METHOD AND APPARATUS FOR PROGRAMMING DATA OF MEMORY CELLS CONSIDERING FLOATING POLY COUPLING

(75) Inventors: Kyoung Lae Cho, Yongin-si (KR); Jun Jin Kong, Yongin-si (KR); Young Hwan Lee, Suwon-si (KR); Nam Phil Jo, Seoul (KR); Sung Chung Park, Daejeon (KR); Seung-Hwan Song, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 77 days.

(21) Appl. No.: 11/905,674

(22) Filed: Oct. 3, 2007

(65) Prior Publication Data
US 2008/0304323 A1 Dec. 11, 2008

(30) Foreign Application Priority Data

Jun. 8, 2007 (KR) .................... 10-2007-0056317

(51) Int. Cl.
*G11C 16/04* (2006.01)
(52) U.S. Cl. ..................... 365/185.18; 365/185.03; 365/185.28; 365/185.24
(58) Field of Classification Search ............ 365/185.18, 365/185.03, 185.28, 185.24, 185.17
See application file for complete search history.

(56) References Cited

U.S. PATENT DOCUMENTS

| 5,450,363 | A | 9/1995 | Christopherson et al. |
| 6,330,185 | B1* | 12/2001 | Wong et al. ............. 365/185.03 |
| 6,504,760 | B1* | 1/2003 | Tedrow ................. 365/185.19 |
| 6,714,457 | B1 | 3/2004 | Hsu et al. |
| 6,987,693 | B2 | 1/2006 | Cernea et al. |
| 7,088,615 | B2 | 8/2006 | Gutterman et al. |
| 7,414,886 | B2* | 8/2008 | Li et al. ................. 365/185.03 |
| 7,474,561 | B2* | 1/2009 | Li et al. ................. 365/185.17 |

FOREIGN PATENT DOCUMENTS

| KR | 1020010011501 A | 2/2001 |
| KR | 2001-0056072 | 7/2001 |
| KR | 1020030011248 A | 2/2003 |
| KR | 1020030063144 A | 7/2003 |
| KR | 10-2005-0084586 | 8/2005 |
| WO | WO 2004/029983 | 4/2004 |

OTHER PUBLICATIONS

Office Action dated May 30, 2008 for corresponding Korean Application No. 10-2007-0056317.

* cited by examiner

*Primary Examiner*—David Lam
(74) *Attorney, Agent, or Firm*—Harness, Dickey & Pierce

(57) ABSTRACT

A method and an apparatus for programming data of memory cells considering coupling are provided. The method includes: calculating a change of a threshold voltage based on source data of the memory cells; converting source data which will be programmed based on the calculated change of the threshold voltage; and programming the converted source data.

11 Claims, 4 Drawing Sheets

METHOD AND APPARATUS FOR PROGRAMMING DATA OF MEMORY CELLS CONSIDERING FLOATING POLY COUPLING

CROSS-REFERENCE TO RELATED APPLICATIONS

This application claims the benefit of Korean Patent Application No. 10-2007-0056317, filed on Jun. 8, 2007, in the Korean Intellectual Property Office, the disclosure of which is incorporated herein by reference.

BACKGROUND OF THE INVENTION

1. Field of the Invention

The present invention relates to programming of data of memory cells, and more particularly, to an apparatus of programming data of memory cells considering a change of a threshold voltage by floating poly coupling among memory cells, and a method using the apparatus.

2. Description of Related Art

A threshold voltage of a flash memory cell is controlled to program data in the flash memory cell. That is, the threshold voltage of the flash memory cell indicates programmed data. As data of neighboring memory cells is programmed, the threshold voltage of the flash memory cell becomes greater due to floating poly coupling with the neighboring memory cells. Accordingly, a probability of an occurrence of errors may be increased. To reduce the occurrence of errors being generated due to the floating poly coupling, a shadow programming method is used. The shadow programming method is a scheme of programming data in a memory cell in order to prevent the floating poly coupling from reaching a maximum. The occurrence of errors due to the floating poly coupling may be reduced by programming data which is required to be programmed by a programming process many times. However, the shadow programming method has problems in that, a lifetime of a memory cell is shortened, and a programming time is increased since a programming process is repeatedly performed many times to program a single data.

BRIEF SUMMARY

An aspect of the present invention provides a method and an apparatus for programming data of memory cells which can reduce an occurrence of a bit error and may increase a lifetime of the memory cells since data is programmed by considering floating poly coupling which is generated between memory cells.

An aspect of the present invention also provides a method and an apparatus for programming data of memory cells in which a programming time can be reduced since data, which will be programmed in the memory cell, is converted by considering a change of a threshold voltage, which is changed due to floating poly coupling, and the converted data is programmed.

An aspect of the present invention also provides a method and an apparatus for programming data of memory cells which can be applied to all types of code systems of source data.

According to an aspect of the present invention, there is provided a method for programming data of memory cells including: calculating a change of a threshold voltage based on source data of the memory cells; converting source data which will be programmed based on the calculated change of the threshold voltage; and programming the converted source data.

The calculating of the change of the threshold voltage may calculate the change of the threshold voltage based on source data of neighboring memory cells, from the memory cells.

In this instance, the method of programming data of memory cells further includes: receiving the source data; and detecting the source data of the neighboring memory cells, from the received source data, wherein the calculating of the change of the threshold voltage calculates the change of the threshold voltage based on the detected source data.

In this instance, the calculating of the change of the threshold voltage calculates the change of the threshold voltage based on the source data of the memory cells to be programmed, from the neighboring memory cells.

In this instance, the calculating of the change of the threshold voltage calculates the change of the threshold voltage based on a floating poly coupling effect by the source data of the memory cells.

In this instance, the converting of the source data converts the source data to data which is in proportional to a difference between a threshold voltage corresponding to the source data and the calculated change of the threshold voltage.

According to an aspect of the present invention, there is provided an apparatus for programming data of memory cells including: memory cells; a voltage change calculation unit calculating a change of a threshold voltage based on source data of the memory cells; a data conversion unit converting source data which will be programmed based on the calculated change of the threshold voltage; and a programming unit programming the converted source data.

In this instance, the apparatus for programming data of memory cells further includes a receiving unit receiving the source data; and a detection unit detecting the source data of the neighboring memory cells, from the received source data, wherein the voltage change calculation unit calculates the change of the threshold voltage based on the detected source data.

In this instance, the voltage change calculation unit calculates the change of the threshold voltage based on the source data of the memory cells to be programmed, from the neighboring memory cells.

In this instance, the voltage change calculation unit calculates the change of the threshold voltage based on a floating poly coupling effect by the source data of the memory cells.

Additional aspects, features, and/or advantages of the invention will be set forth in part in the description which follows and, in part, will be apparent from the description, or may be learned by practice of the invention.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION OF EMBODIMENTS

Figure 1:
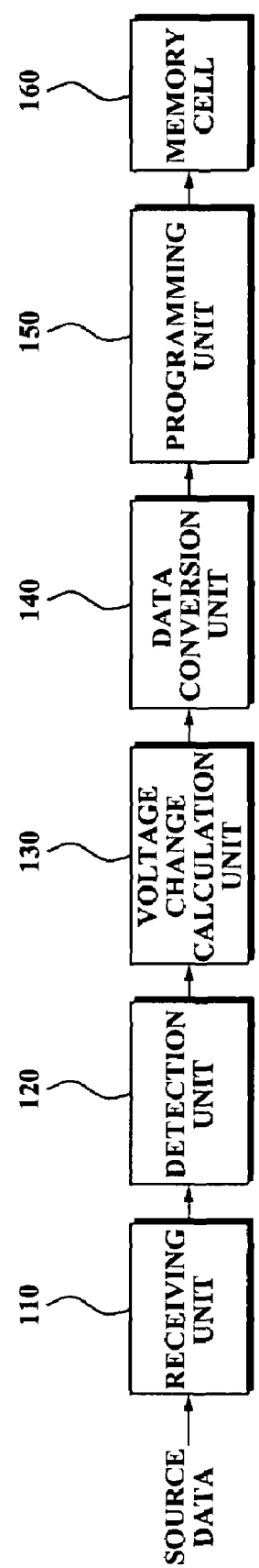
FIG. 1 is a block diagram illustrating an apparatus for programming data of memory cells according to an exemplary embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Terminology used in the present specification is covered before describing in greater detail. However, depending on different circumstances, the terminology in the present specification may be understood based on dictionaries, theses, precedents, and the like.

FIG. 1 is a block diagram illustrating an apparatus for programming data of memory cells according to an exemplary embodiment of the present invention.

Referring to FIG. 1, the apparatus for programming data of the memory cells includes a receiving unit 110, a detection unit 120, a voltage change calculation unit 130, a data conversion unit 140, and a programming unit 150.

The receiving unit 110 receives source data which will be programmed in memory cells, which are included in a memory. In this instance, the memory may include a flash memory of NAND and NOR types. Also, the memory may include a flash memory of a multi level cell (MLC) method or a single level cell (SLC) method, however, is not limited to the flash memory, and may be all types of applicable memories.

The detection unit detects source data of the neighboring memory cells, which are neighboring with a memory cell 160 whose source data are being programmed, from the received source data. That is, the detection unit 120 affects programmed source data of the memory cell 160 after the source data of the memory cell 160 is programmed, detects memory cells capable of changing a threshold voltage of the memory cell 160, and detects the source data with respect to the detected memory cells.

In this instance, the detection unit 120 may detect the source data of the neighboring memory cells of the memory cell 160, the neighboring memory cells possibly capable of affecting the programmed data of the memory cell 160. In this instance, the neighboring memory cells indicate memory cells in which floating poly coupling may occur with the memory cell 160. That is, the detection unit 120 detects the source data of the memory cells which may be capable of affecting the programmed data in the memory cell 160 since floating coupling occurs with the memory cell 160.

In this instance, the detection unit 120 may detect source data of memory cells which will be programmed, from the neighboring memory cells. That is, the detection unit 120 exclusively detects the source data of the memory cells which will be programmed, from the neighboring memory cells, since memory cells, whose source data have been programmed already, may not affect the memory cell 160.

The voltage change calculation unit 130 calculates change of the threshold voltage based on the source data of the memory cells detected by the detection unit 120. Specifically, the voltage change calculation unit 130 calculates the change of the threshold voltage with respect to an amount the threshold voltage is changed by using a threshold voltage corresponding to the source data of the memory cells which is detected by the detection unit 120. In this instance, the voltage change calculation unit 130 may calculate the change of the threshold voltage based on floating poly coupling by the source data of the memory cell detected by the detection unit 120.

In this instance, the voltage change calculation unit 130 may calculate the change of the threshold voltage based on channel features of the memory cells, in addition to the source data of the memory cells detected by the detection unit 120. Specifically, the voltage change calculation unit 130 calculates the change of the threshold voltage by considering the source data of the detected memory cells by the detection unit 120 and channel features of and NAND flash memory cells, when memory cells are the NAND flash memory cells.

In this instance, the voltage change calculation unit 130 may calculate the change of the threshold voltage based on data which indicates change of the threshold voltage with respect to each of the source data which can be programmed. As an example, when a memory cell is a two-bit MLC memory cell, the voltage change calculation unit 130 may calculate levels of the change of the threshold voltage of the memory cell 160 using the change of the threshold voltage of the memory cell 160, which occurs due to each of threshold voltages corresponding to source data 00, 01, 10, and 11.

In this instance, the change of the threshold voltage with respect to each of the source data may be obtained via storage devices equipped in the apparatus of programming data of the memory cell of the present invention, outer storage devices, and hardware devices such as a logic circuit.

As described above, the change may differ according to the detected source data by the detection unit 120 since the voltage change calculation unit 130 calculates the change of the threshold voltage based on the detected source data by the detection unit 120. That is, the voltage change calculation unit 130 calculates the change of the threshold voltage based on the source data of the neighboring memory cells when the detected source data corresponds to the source data of the neighboring memory cells of the memory cell 160, and calculates the change of the threshold voltage based on the source data of the memory cells which will be programmed when the detected source data corresponds to the source data of the memory cells which will be programmed, from the neighboring memory cells of the memory cell 160.

The data conversion unit 140 converts source data which will be programmed in the memory cells 160 based on the change of the threshold voltage calculated by the voltage change calculation unit 130. That is, the data conversion unit 140 converts the source data to data which corresponds to a difference between a threshold voltage corresponding to real source data and the change of the threshold voltage so that a converted threshold voltage of the memory cell 160, which is converted since source data of memory cells corresponds to a threshold voltage of real source data.

The programming unit 150 programs the data, which is converted by the data conversion unit 140, in the memory cell 160.

The apparatus of programming the data of the memory cell according to the present invention having the above described configuration may be applicable to all types of coding methods, not limited to specific coding methods such as a binary coding methods and a grey coding method.

Figure 2:
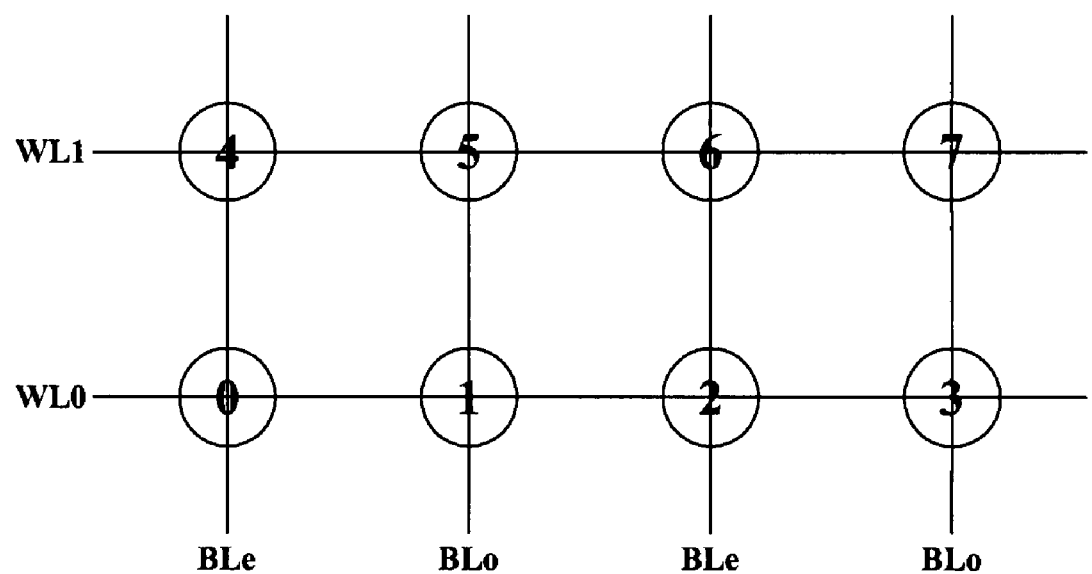
FIG. 2 is a diagram illustrating an apparatus for programming data of memory cells according to an exemplary embodiment of the present invention.
Figure 3:
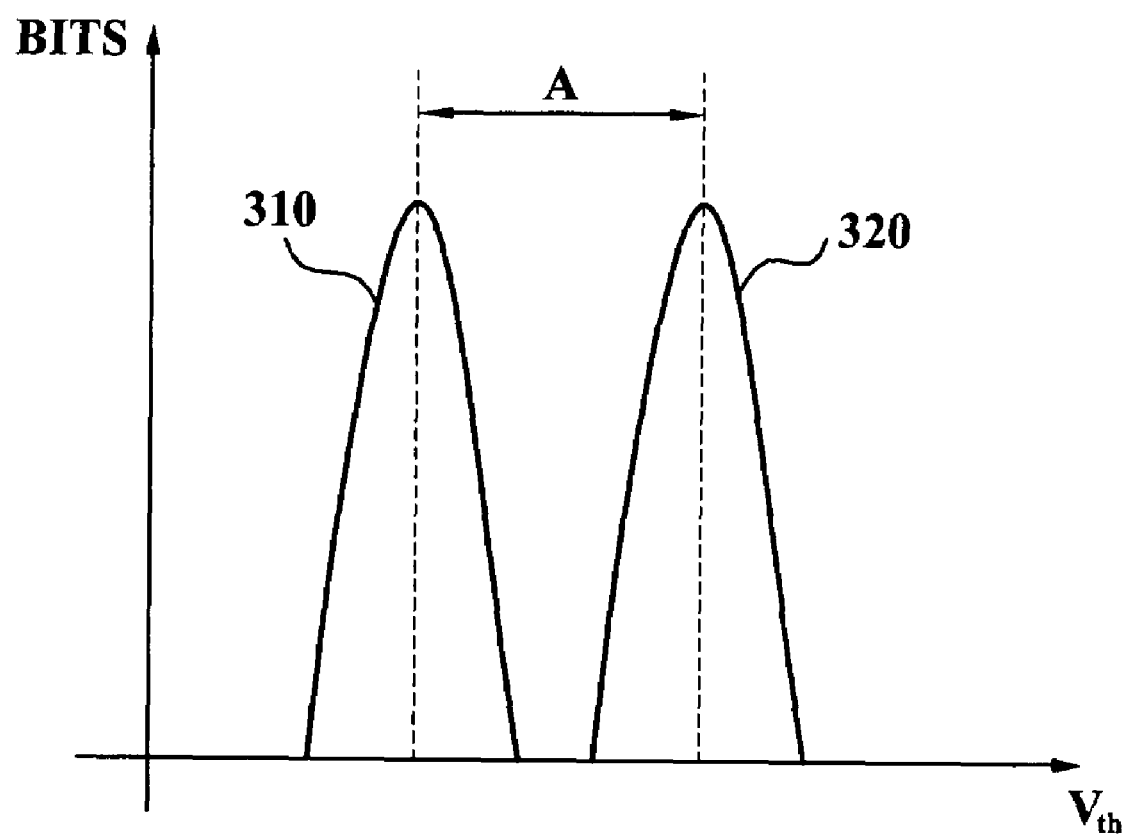
FIG. 3 is a diagram illustrating source data and program data of the memory cells of FIG. 2.

Hereinafter, further operations of the apparatus of programming the data of the memory cell according to an embodiment of the present invention will be described by referring to FIGS. 2 and 3. In FIGS. 2 and 3, a change of a threshold voltage is performed using source data.

FIG. 2 is a diagram illustrating an apparatus for programming data of memory cells according to an exemplary embodiment of the present invention, and FIG. 3 is a diagram illustrating source data and program data of the memory cells of FIG. 2.

Referring to FIG. 2, memory cells in even bit lines of a first word line (WL0) are programmed, subsequently memory cells in odd bit lines of the first word line (WL0) are programmed. The above-described programming operation is sequentially performed with respect to a subsequent word line (WL1) and all word lines. That is, memory cells 0 and 2 are initially programmed, memory cells 1 and 3 are programmed next, memory cells 4 and 6 are programmed next, and finally memory cells 5 and 7 are programmed. Accordingly, memory cell 0 may be exposed to a floating poly coupling effect by source data of memory cells 1, 3, 4, 5, and 7. In this instance, it is possible that memory cells 3, 6, and 7 affect source data of memory cell 0, however it is assumed that memory cells 3, 6, and 7 has an affect less than the source data of neighboring memory cells, that is, memory cells 1, 4, and 5, so effects by memory cells 1, 4, and 5 will be considered in the specification of the present invention.

The receiving unit 110 receives source data which will be programmed in memory cells 0 through 7. The detection unit 102 detects the source data of the neighboring memory cells, that is, memory cells 1, 4, and 5, from the received source data. The voltage change calculation unit 130 calculates change of a threshold voltage based on the detected source data of memory cells 1, 4, and 5. That is, the voltage change calculation unit 130 calculates an amount a threshold voltage of data, which will be programmed in memory cell 0, is changed by the source data of memory cells 1, 4, and 5.

When source data is programmed in memory cell 1, the voltage change calculation unit 130 may calculate a change of a threshold voltage of memory cell 1 based on source data of memory cells 4 through 6 since the memory cells 0 and 2 are already programmed.

In this instance, the voltage change calculation unit 130 may calculate the change of the threshold voltage based on the change of a threshold voltage according to each source data of neighboring memory cells. Specifically, a change of a threshold voltage of memory cell 0 by memory cell 1, a change of a threshold voltage of memory cell 0 by memory cell 4, and a change of a threshold voltage of memory cell 0 by memory cell 5 are summed up, and the summed-up value may be the change of the threshold voltage of memory cell 0. Also, the change of the threshold voltage of memory cell 0 may be calculated using a predetermined algorithm or a function.

The data conversion unit 140 converts source data 320 of FIG. 3 of memory cell 0, which is received in the receiving unit 110, when a change of a threshold voltage of memory cell 0 is 'A', as illustrated in FIG. 3. That is, the data conversion unit 140 converts the source data of memory cell 0 to data 310 of FIG. 3, the data 310 corresponding to a difference between the change 'A' of the threshold voltage calculated by the voltage change calculation unit 130.

The programming unit 150 programs the converted data by the data conversion unit 140 in memory cell 0. As an example, the converted data 310 of FIG. 3 is programmed in memory cell 0.

Referring to memory cell 2, similar to memory cell 0, source data of memory cell 2 is converted based on a change of a calculated threshold voltage after calculating the change of the threshold voltage of memory cell 2 based on source data of memory cells 1, 3, 5, 6, and 7 to be programmed, among neighboring memory cells.

The programming unit 150 programs the converted source data of memory cell 2 in memory cell 2.

As described above, in a memory cell to be programmed, the apparatus for programming data of the memory cells according to the exemplary embodiment of the present invention calculates a change of a threshold voltage based on source data of neighboring memory cells capable of causing a change of the threshold voltage, coverts to program the calculated change of the threshold voltage to data having a threshold voltage which corresponds to a difference between the calculated change of the threshold voltage and a threshold voltage of source data required to be programmed, thereby reducing a bit error of data which is stored in a memory cell.

Figure 4:
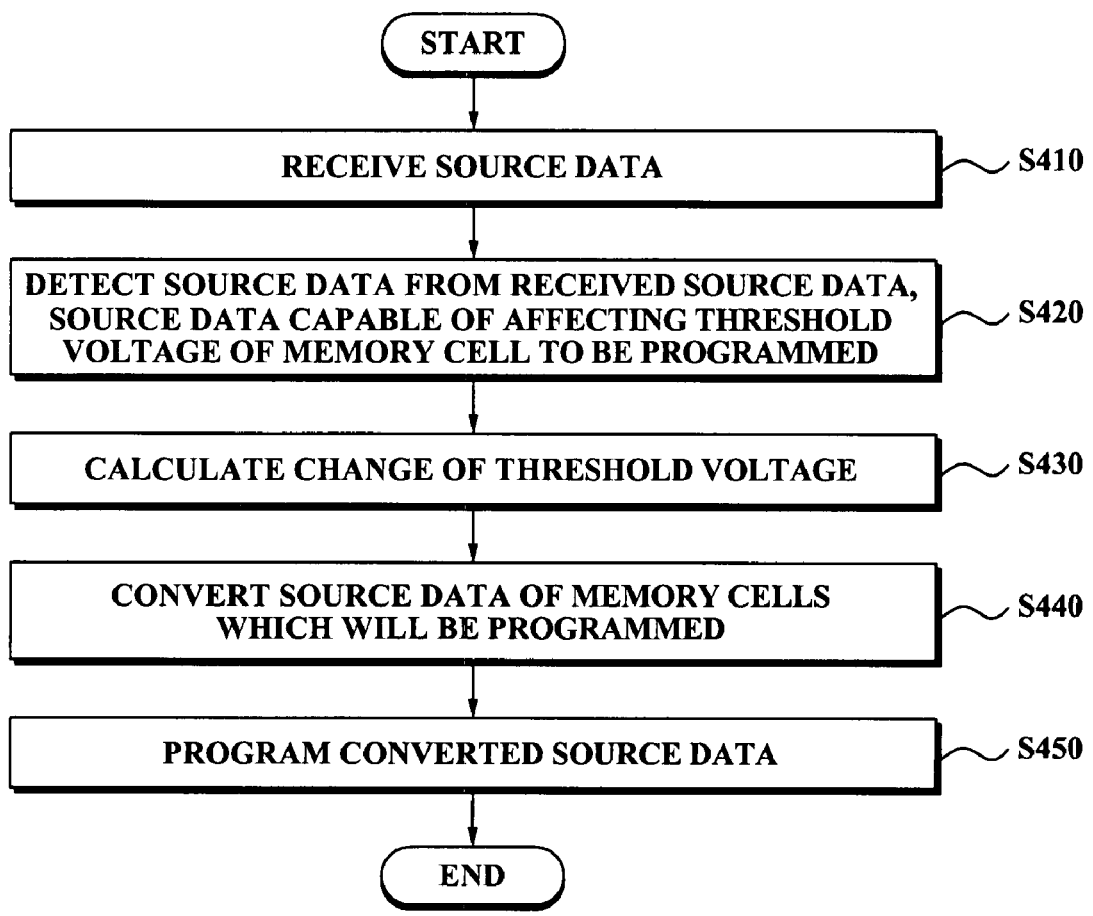
FIG. 4 is a flowchart illustrating a method for programming data of memory cells according to an exemplary embodiment of the present invention.

FIG. 4 is a flowchart illustrating a method for programming data of memory cells according to an exemplary embodiment of the present invention.

Referring to FIG. 4, source data, which will be programmed in memory cells constituting a memory, is received in operation S410. In this instance, the memory may include flash memory cells of an SLC method, or a flash memory cells of an MLC method.

In operation S420, source data capable of affecting a threshold voltage of memory cells, which are required to be programmed, is detected to store accurate data in a memory cell which will be programmed. In this instance, the detected source data may be source data except source data of a memory cell which will be programmed. As an example, in a memory structure of FIG. 2, when memory cell 0 is required to be programmed, detected source data are source data of memory cells 1, 3, 4, 5, 6, and 7, except source data of memory cells 0 and 2, since memory cell 2 is simultaneously programmed with memory cell 0.

In this instance, the detected source data may be source data of neighboring memory cells of the memory cell which will be programmed. In this instance, the detected source data may be source data of memory cells which are programmed after the source data of the memory cell required to be programmed, from the neighboring memory cells. In this instance, the detected source data may be source data of memory cells which are affected by the memory cell required to be programmed and floating poly coupling.

When the source data capable of affecting the threshold voltage is detected, a change of threshold voltage of the memory cell required to be programmed is calculated based on the detected source data in operation S430. In this instance, the method for programming data of memory cells according to the exemplary embodiment of the present invention may calculate the change of the threshold voltage based on a floating poly coupling effect between memory cells which are generated by source data of the detected memory cells and the memory cell required to be programmed.

In this instance, the change of the threshold voltage of the memory cell required to be programmed may be calculated based on threshold voltages which are changed according to each source data. In this instance, the threshold voltages which are changed according to each source data may differ according to a code system being used, and may be acquired by measurement and simulation.

In this instance, the threshold voltages which are changed according to each source data may be indicated as predetermined values or values having stochastic distribution. In this instance, the change of the threshold voltage of memory cell required to be programmed may be calculated based on both source data of memory cells capable of affecting the threshold voltage and channel features of the memory cells.

In operation S440, the source data of the memory cell which will be programmed is converted based on a change of threshold voltage due to source data of neighboring memory cells or source data of memory cells which are programmed after the source data of the memory cell required to be programmed.

In this instance, the source data of the memory cell may be converted to data having a threshold voltage corresponding to a difference between a threshold voltage of source data required to be programmed in a memory cell, and a change of a threshold voltage, which is calculated in operation S430.

In operation S450, the data, whose source data has been converted based on the change of the calculated change of the threshold voltage, is programmed in the memory cell.

As described from the method for programming data of the memory cells according to the present invention, data which will be programmed in a memory cell is different from source data which is actually required to be programmed, and is, however, source data of a converted threshold voltage, which is converted by considering floating poly coupling by of data neighboring memory cells after being programmed.

As described above, in comparison to a shadow programming method, a programming time may be reduced, and errors in data may be reduced.

The method for programming data of memory cells according to the above-described exemplary embodiments of the present invention may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention.

A method and an apparatus for programming data of memory cells according to the above-described exemplary embodiments of the present invention may reduce an occurrence of a bit error and may increase a lifetime of the memory cells since data is programmed by considering floating poly coupling which is generated between memory cells.

Also, a method and an apparatus for programming data of memory cells according to the above-described exemplary embodiments of the present invention may reduce a programming time since data, which will be programmed in the memory cell, is converted by considering a change of a threshold voltage, which is changed due to floating poly coupling, and the converted data is programmed.

Also, a method and an apparatus for programming data of memory cells according to the above-described exemplary embodiments of the present invention may be applicable to all types of code systems of source data.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A method for programming data of memory cells, comprising:
   receiving source data of the memory cells;
   detecting source data of neighboring memory cells, from the received source data;
   calculating a change of a threshold voltage based on the detected source data;
   converting at least one of the received source data and detected source data which will be programmed based on the calculated change of the threshold voltage; and
   programming the converted source data.

2. The method of claim 1, wherein the calculating of the change of the threshold voltage calculates the change of the threshold voltage based on the detected source data to be programmed, from the neighboring memory cells.

3. The method of claim 1, wherein the calculating of the change of the threshold voltage calculates the change of the threshold voltage based on a floating poly coupling effect by the detected source data.

4. The method of claim 1, wherein the converting of the at least one of the received source data and detected source data converts the at least one of the received source data and detected source data to data which is proportional to a difference between a threshold voltage corresponding to the at least one of the received source data and detected source data and the calculated change of the threshold voltage.

5. The method of claim 1, wherein the calculating of the change of the threshold voltage calculates the change of the threshold voltage based on the detected source data and channel characteristics.

6. A computer-readable storage medium storing a program for implementing a method of programming data of a memory cell, the method comprising:
   receiving source data of the memory cells;
   detecting source data of neighboring memory cells, from the received source data;
   calculating a change of a threshold voltage based on the detected source;
   converting at least one of the received source data and detected source data which will be programmed based on the calculated change of the threshold voltage; and
   programming the converted source data.

7. An apparatus for programming data of memory cells, comprising:
   memory cells;
   a receiving unit receiving source data of the memory cells;
   a detection unit source data of neighboring memory cells, from the received source data;
   a voltage change calculation unit calculating a change of a threshold voltage based on the detected source data;
   a data conversion unit converting at least one of the received source data and detected source data which will be programmed based on the calculated change of the threshold voltage; and
   a programming unit programming the converted source data.

8. The apparatus of claim 7, wherein the voltage change calculation unit calculates the change of the threshold voltage based on the detected source data to be programmed, from the neighboring memory cells.

9. The apparatus of claim 7, wherein the voltage change calculation unit calculates the change of the threshold voltage based on a floating poly coupling effect by the detected source.

10. The apparatus of claim 7, wherein the data conversion unit converts the at least one of the received source data and detected source data to data which is proportional to a difference between a threshold voltage corresponding to the at least one of the received source data and detected source data and the calculated change of the threshold voltage.

11. The apparatus of claim 7, wherein the voltage change calculation unit calculates the change of the threshold voltage based on the detected source data and channel characteristics.

* * * * *